(12) United States Patent
Embong et al.

(10) Patent No.: US 6,475,834 B2
(45) Date of Patent: Nov. 5, 2002

(54) METHOD OF MANUFACTURING A SEMICONDUCTOR COMPONENT AND SEMICONDUCTOR COMPONENT THEREOF

(75) Inventors: Saat Shukri Embong, Kuala Terengganu (MY); Dave Culbertson, Tempe, AZ (US); Chee Hiong Chew, Negeri Sembilan (MY)

(73) Assignee: Semiconductor Components Industries LLC, Phoenix, AZ (US)

( * ) Notice: Subject to any disclaimer, the term of this patent is extended or adjusted under 35 U.S.C. 154(b) by 36 days.

(21) Appl. No.: 09/728,392

(22) Filed: Dec. 4, 2000

(65) Prior Publication Data

US 2002/0066962 A1 Jun. 6, 2002

(51) Int. Cl.[7] .............................................. H01L 21/44
(52) U.S. Cl. ...................................... 438/123; 438/112
(58) Field of Search ................................ 438/106, 111, 438/112, 118, 119, 121, 123, 124, 127

(56) References Cited

U.S. PATENT DOCUMENTS 4,994,412 A  *  2/1991  Kalfus et al. ................ 438/123
5,970,320 A  *  10/1999  Yamasaki et al. ........... 438/123

* cited by examiner

Primary Examiner—John F. Niebling
Assistant Examiner—Christopher Lattin

(57) ABSTRACT

A method of manufacturing a semiconductor component includes coupling a clip bond (230) from a semiconductor chip (120) to a lead frame (110) and dividing the clip bond into at least first and second portions separated from each other.

20 Claims, 9 Drawing Sheets

US 6,475,834 B2

METHOD OF MANUFACTURING A SEMICONDUCTOR COMPONENT AND SEMICONDUCTOR COMPONENT THEREOF

FIELD OF THE INVENTION

This invention relates to electronics, in general, and to methods of manufacturing semiconductor components and semiconductor components thereof, in particular.

BACKGROUND OF THE INVENTION

A semiconductor component typically includes a metal lead frame, a semiconductor die mounted on the metal lead frame, and wire bonds electrically connecting the semiconductor die to the lead frame. The electrical performance of this type of semiconductor component suffers from high electrical resistance and inductance of each of the wire bonds.

Another type of semiconductor component uses a plurality of wire bonds and a clip bond to electrically connect the semiconductor die to the metal lead frame. This type of semiconductor component is, however, relatively expensive because of the use of two different types of electrical connections between the semiconductor die and the metal lead frame. Multiple clip bonds cannot be individually assembled in the semiconductor component in a simple manner to completely replace the wire bonds because of pitch and size limitations of the multiple clip bonds and also because of an electrical shorting problem occurring during solder reflow.

Accordingly, a need exists for a method of manufacturing a semiconductor component that is not expensive and that has a high manufacturing throughput. The resulting semiconductor component should have a die-to-lead frame interconnect system that has low parasitic resistances and inductances.

BRIEF DESCRIPTION OF THE DRAWINGS

The invention will be better understood from a reading of the following detailed description, taken in conjunction with the accompanying drawing figures in which:

FIG. 5 illustrates a cross-sectional view of the semiconductor component of FIG. 4 taken along a section line 5—5 in FIG. 4 in accordance with an embodiment of the invention;

Figure 1:
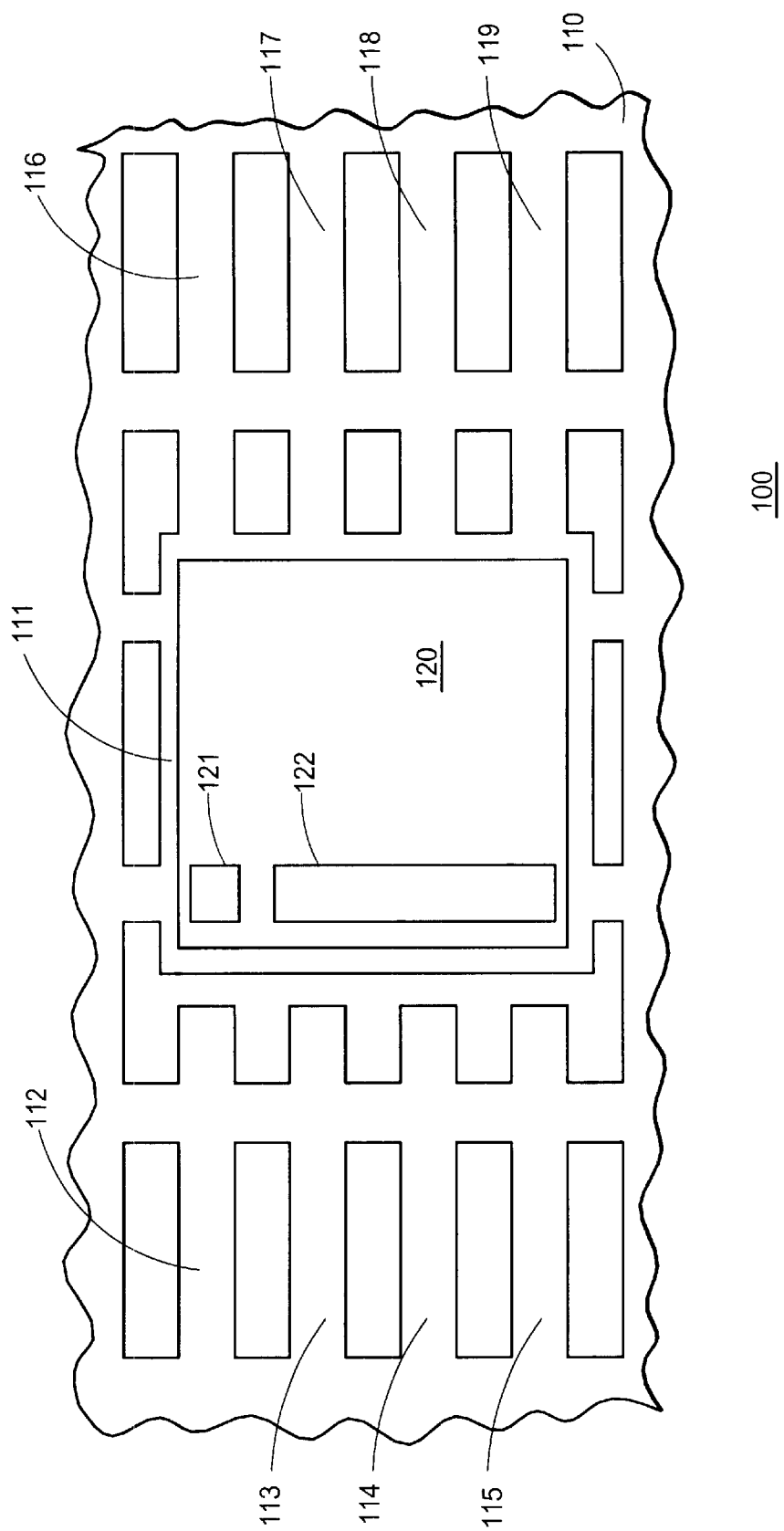
FIG. 1 illustrates a top view of a portion of a semiconductor component in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein.

Moreover, the terms top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than described or illustrated herein.

DETAILED DESCRIPTION OF THE DRAWINGS

FIG. 1 illustrates a top view of a portion of a semiconductor component 100. Component 100 includes, among other features, a lead frame 110. In the preferred embodiment, lead frame 110 is a stamped metal lead frame and includes a flag portion 111 and a plurality of leads 112, 113, 114, 115, 116, 117, 118, and 119. Tie bars and dam bars physically couple together flag portion 111 and leads 112 through 119. One skilled in the art will understand that lead frame 110 is one of a plurality of lead frames formed from a single sheet of metal. In other embodiments, lead frame 110 can be a ceramic chip carrier, a ball grid array substrate, or the like.

Component 100 also includes a semiconductor chip 120. Chip 120 is mounted or located over flag portion 111 of lead frame 110. Chip 120 includes a semiconductor substrate and can also include a plurality of semiconductor, metal, and dielectric or non-electrically conductive layers. The substrate and layers of chip 120 are patterned and optionally doped to form a semiconductor device within chip 120. In the preferred embodiment, the semiconductor device is a discrete transistor. In another embodiment, the semiconductor device can be an integrated circuit. Chip 120 further includes bonding pads 121 and 122 electrically coupled to the semiconductor device.

Figure 2:
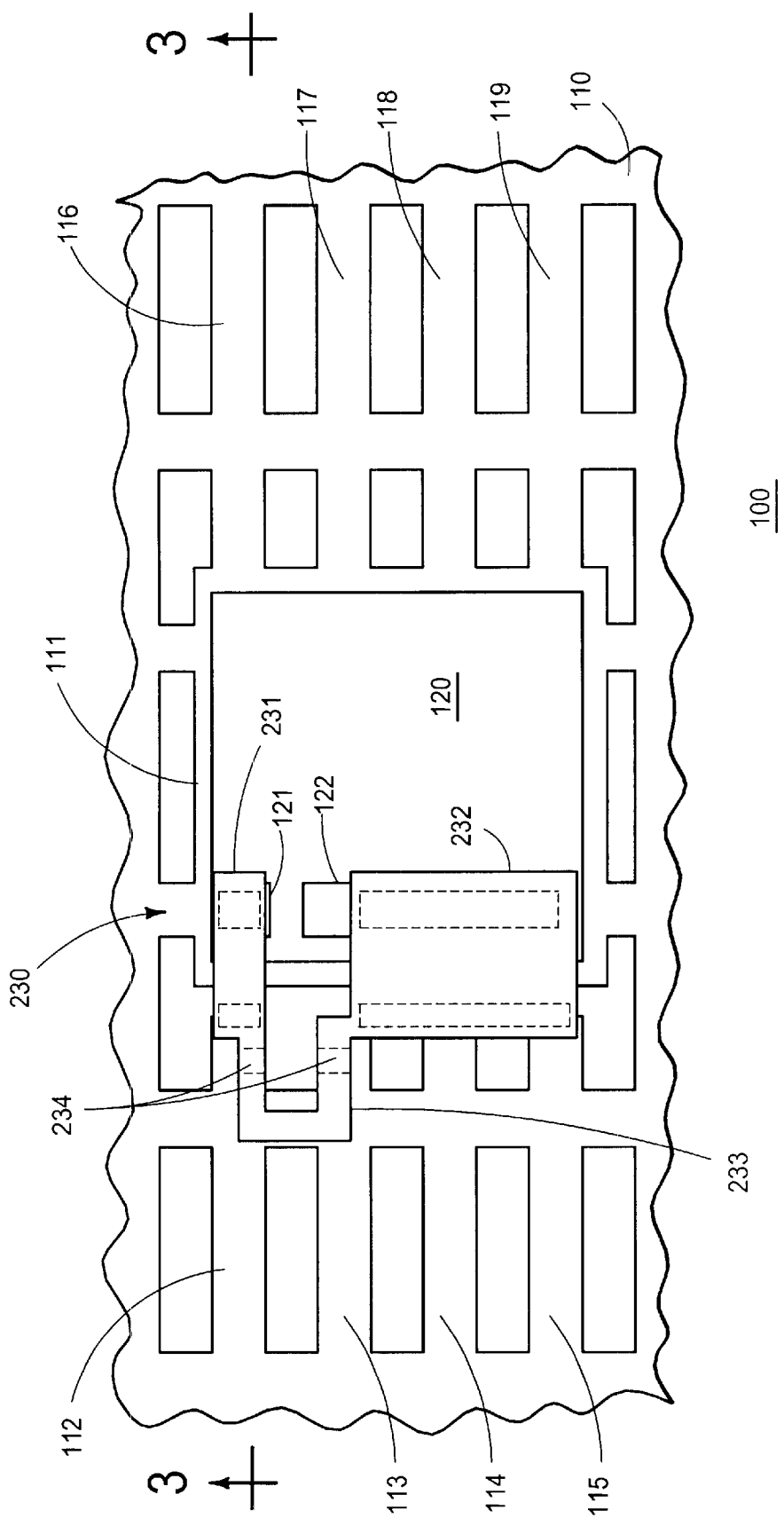
FIG. 2 illustrates a top view of the portion of the semiconductor component after a later step of a manufacturing process in accordance with an embodiment of the invention.
Figure 3:
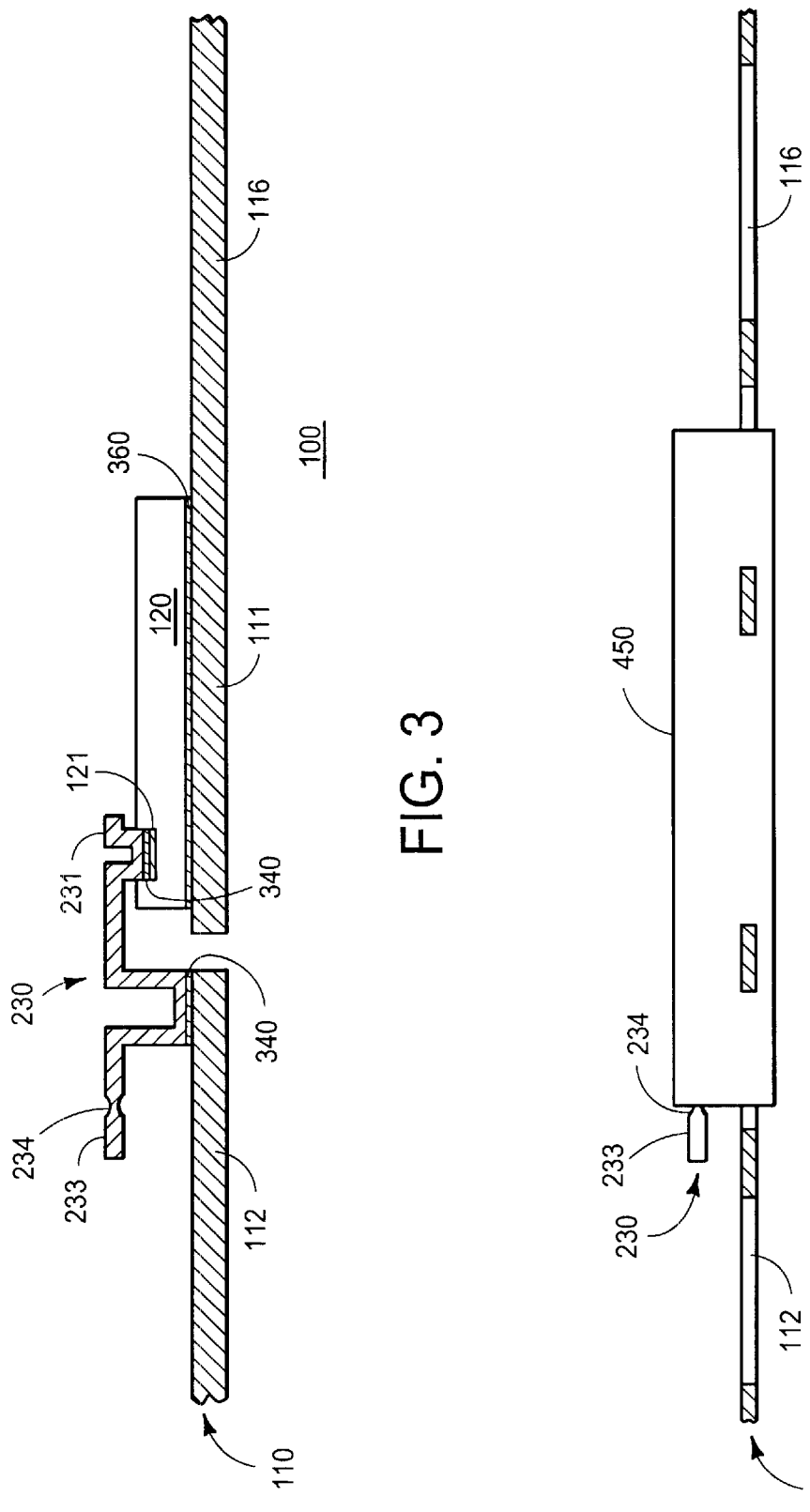
FIG. 3 illustrates a cross-sectional view of the portion of the semiconductor component of FIG. 2 taken along a section line 3—3 in FIG. 2 in accordance with an embodiment of the invention.

FIG. 2 illustrates a top view of a portion of semiconductor component 100 after a later step in a manufacturing process for component 10, and FIG. 3 illustrates a cross-sectional view of the portion of component 100 taken along a section line 3–3 in FIG. 2. Component 100 is illustrated in FIGS. 2 and 3 to include a clip bond 230. Clip bond 230 is located over chip 120 and lead frame 110, and clip bond 230 couples chip 120 to lead frame 110. In particular, a portion 231 of clip bond 230 is located over bonding pad 121 of chip 120 and over lead 112 of lead frame 110. Furthermore, a portion 232 of clip bond 230 is located over bonding pad 122 of chip 120 and leads 113, 114, and 115 of lead frame 110. As an example, clip bond 230 can be comprised of a metal layer and can be formed by a stamping or punching process similar to that used for forming lead frame 110.

Clip bond 230 also includes a portion 233 physically and electrically coupling together portions 231 and 232. Clip bond 230 further optionally includes notches 234 separating portion 233 from portions 231 and 232. Notches 234 facilitate the subsequent removal of portion 233 from portions 231 and 232.

Component 100 further includes solder 340 and 360. Solder 340 is used to electrically couple and adhere portions 231 and 232 of clip bond 230 to leads 112, 113, 114, and 115 of lead frame 110 and also to bonding pads 121 and 122 of chip 120. Solder 360 is used to adhere chip 120 to flag portion 111 of lead frame 110. Solder 360 can also be used to electrically couple the semiconductor device in chip 120 to leads 116, 117, 118, and 119. Solder 340 and 360 can be replaced by conductive epoxies, anisotropic conductive films, or the like.

Figure 4:
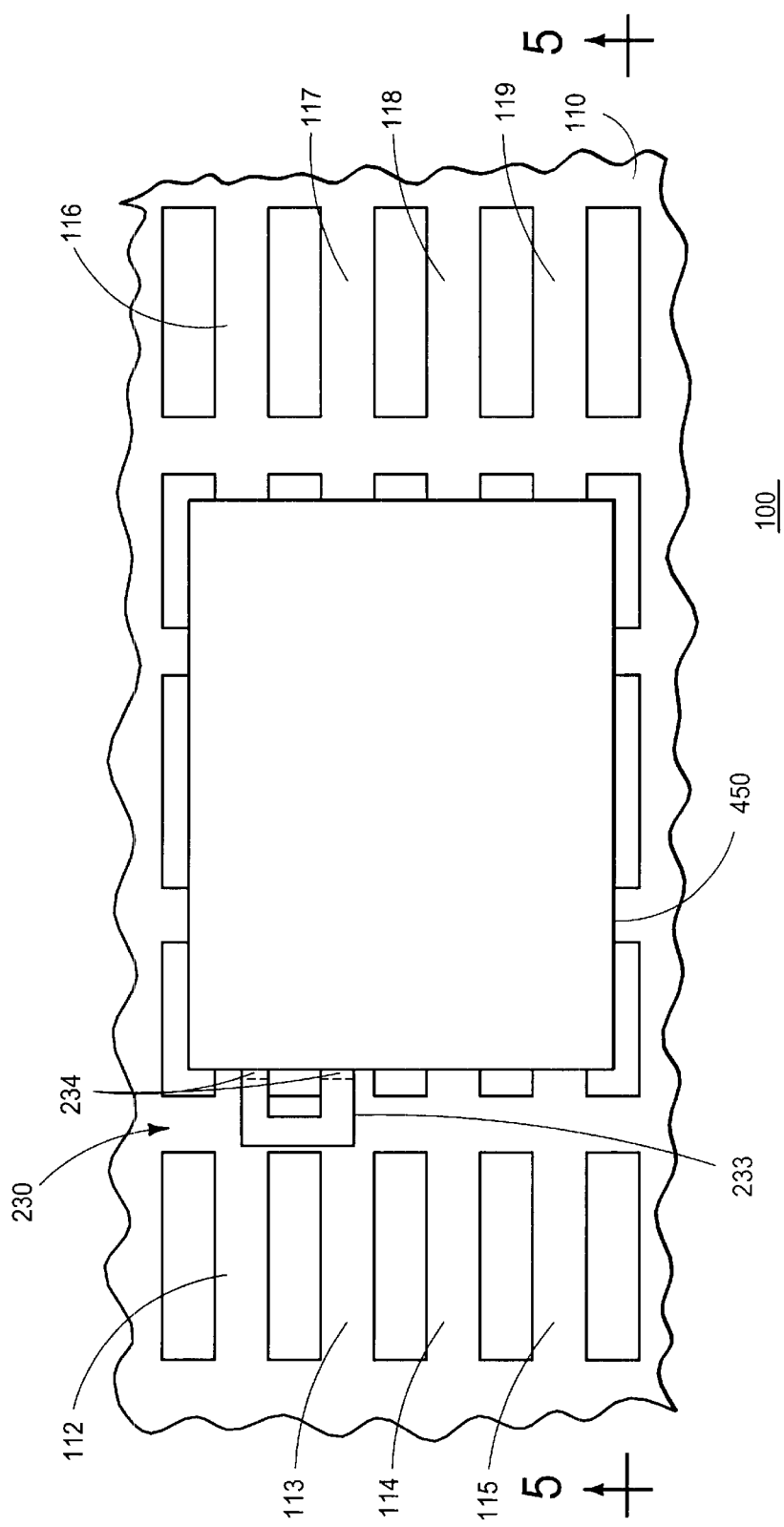
FIG. 4 illustrates a top view of the semiconductor component after a subsequent step in the manufacturing process in accordance with an embodiment of the invention.

FIG. 4 illustrates a top view of semiconductor component 100 after a subsequent step in the manufacturing process, and FIG. 5 illustrates a cross-sectional view of component 100 taken along a section line 5—5 in FIG. 4. Component 100 is illustrated in FIGS. 4 and 5 to include a packaging material 450 that is molded around and encapsulates chip 120 (FIGS. 1 through 3), at least a portion of lead frame 110, and at least portions 231 and 232 (FIGS. 2 and 3) of clip bond 230. Portion 233 of clip bond 230 protrudes or extends from packaging material 450. Notches 234 of clip bond 230 are preferably located at or adjacent to an outside edge of packaging material 450.

Figure 6:
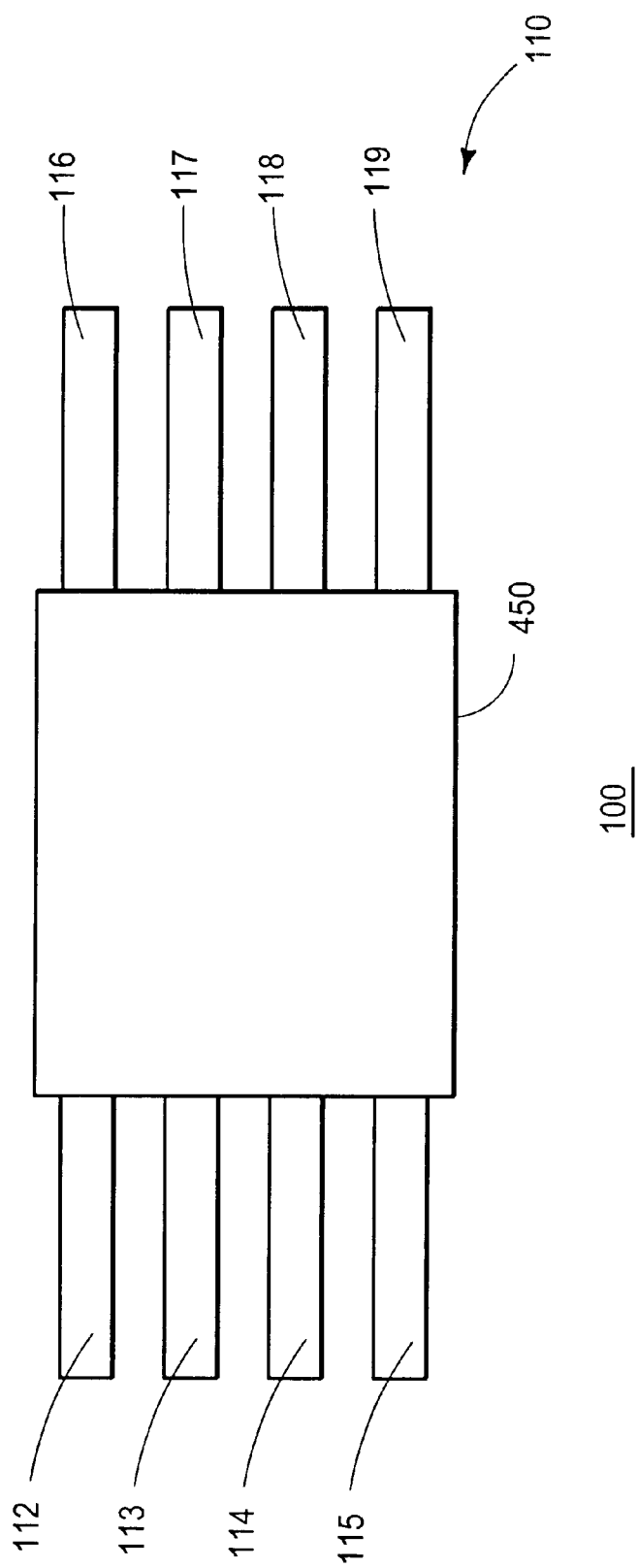
FIG. 6 illustrates a top view of the semiconductor component after an even later step in the manufacturing process in accordance with an embodiment of the invention.
Figure 7:
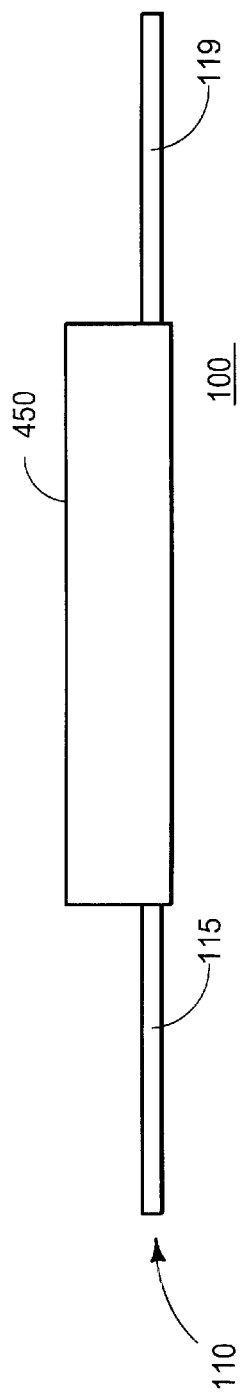
FIG. 7 illustrates a side view of the semiconductor component of FIG. 6 in accordance with an embodiment of the invention.

FIG. 6 illustrates a top view of semiconductor component 100 after an even later step in the manufacturing process, and FIG. 7 illustrates a side view of component 100 after the even later step. Lead frame 110 is trimmed to singulate component 100 and to remove the tie bars and dam bars from lead frame 110. Portion 233 (FIGS. 4 and 5) of clip bond 230 is also removed from clip bond 230 to electrically isolate portions 231 and 232 (FIGS. 2 and 3) of clip bond 230 from each other. This removal process divides or separates clip bond 230 into at least two portions electrically isolated from each other.

Figure 9:
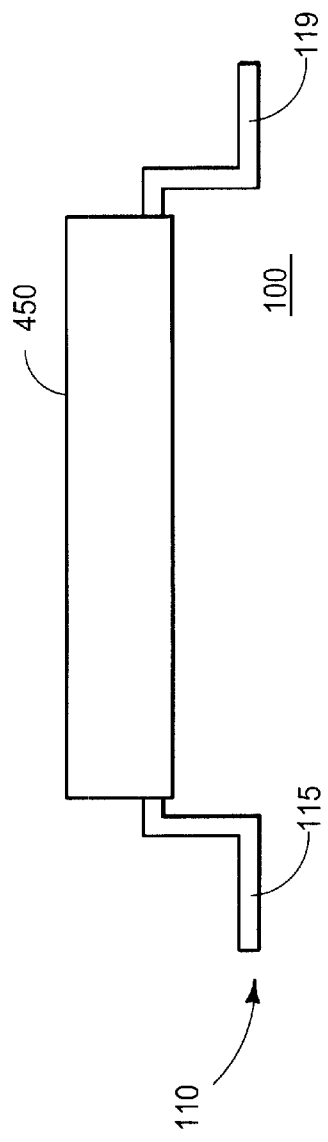
FIG. 9 illustrates a side view of the semiconductor component of FIG. 8 in accordance with an embodiment of the invention.
Figure 8:
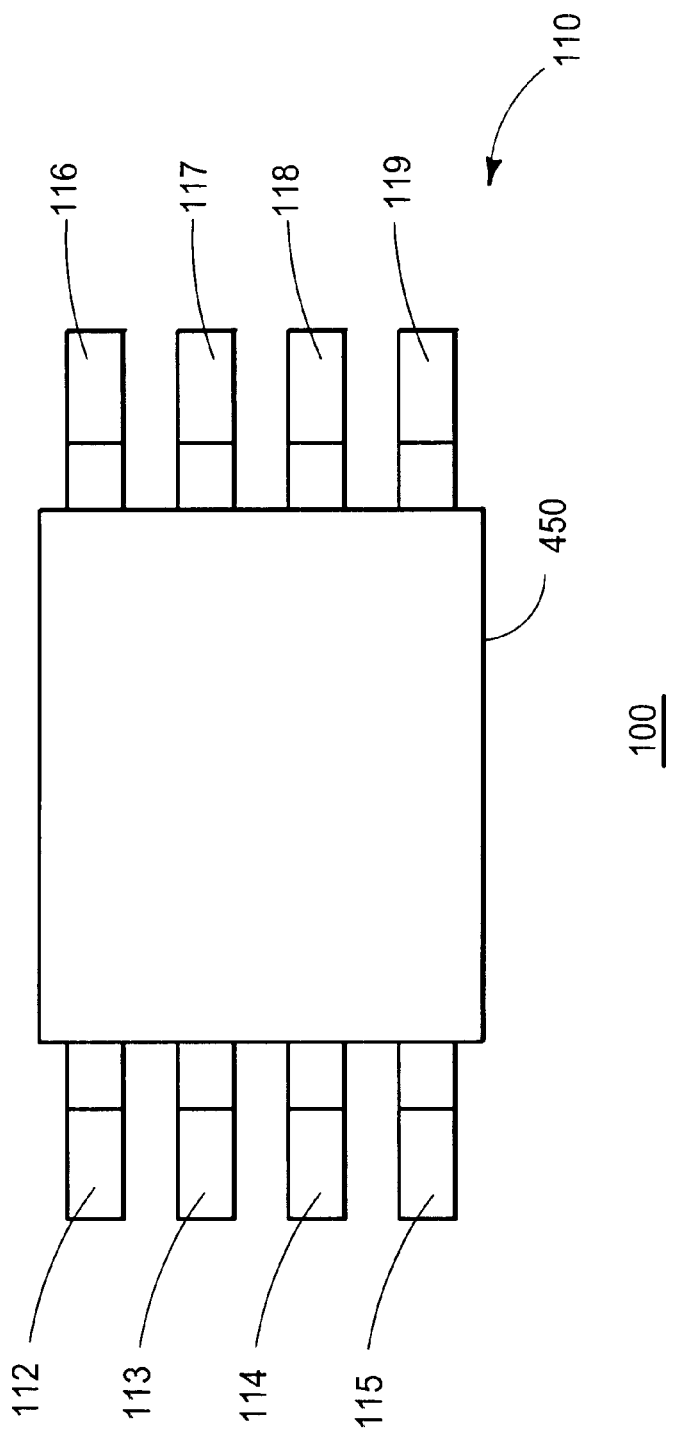
FIG. 8 illustrates a top view of the semiconductor component after a subsequent step in the manufacturing process in accordance with an embodiment of the invention.

FIG. 8 illustrates a top view of a portion of semiconductor component 100 after a subsequent step in the manufacturing process, and FIG. 9 illustrates a side view of component 100 after the subsequent step. Leads 112 through 119 of lead frame 110 are bent or formed into a gull-wing configuration. Leads 112 through 119 of lead frame 110 can also be bent into other configurations including, but not limited to, a surface-mount configuration.

Figure 10:
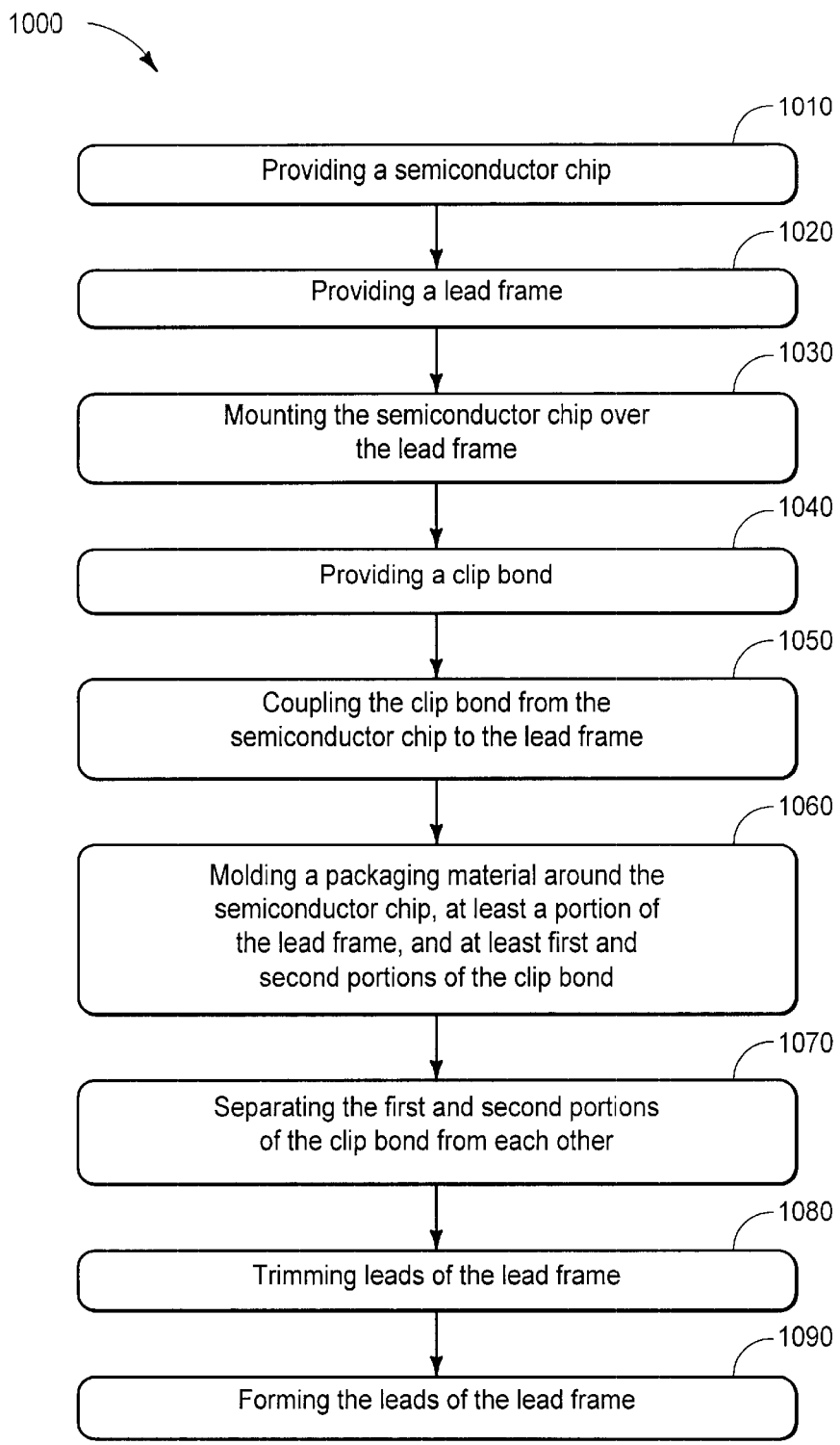
FIG. 10 illustrates a flow chart of a method of manufacturing a semiconductor component in accordance with an embodiment of the invention.

FIG. 10 illustrates a flow chart 1000 of a method of manufacturing semiconductor components. At a step 1010 of flow chart 1000, a semiconductor chip is provided. The semiconductor chip contains a semiconductor device. Step 1010 can be performed by purchasing a semiconductor chip having the semiconductor device already manufactured in it. Step 1010 can also be performed by manufacturing a semiconductor device in the semiconductor chip.

At a step 1020 of flow chart 1000, a lead frame is provided. The lead frame can be purchased or can be stamped or punched from a sheet of metal. Then, at a step 1030, the semiconductor chip is mounted over the lead frame.

At step 1040 of flow chart 1000, a clip bond is provided. Step 1040 can be performed by purchasing the clip bond. Step 1040 can also be performed by stamping or punching the clip bond from a sheet of metal.

Subsequently, at a step 1050, a clip bond is coupled from the semiconductor chip to the lead frame. In the preferred embodiment, step 1050 and flow chart 1000 include coupling only a single clip bond to the semiconductor chip and the lead frame. Also in the preferred embodiment, step 1050 occurs after step 1030. Furthermore, in the preferred embodiment of step 1050 and flow chart 1000, a wire bond is preferably avoided or not used to electrically couple the semiconductor chip to the lead frame.

Next, at a step 1060 of flow chart 1000, a packaging material is molded around the semiconductor chip, at least a portion of the lead frame, and at least first and second portions of the clip bond. In the preferred embodiment, step 1060 occurs after step 1050. Also in the preferred embodiment of step 1060, at least a third portion of the clip bond is prevented from being encapsulated or molded by the packaging material where the third portion couples together the first and second portions of the clip bond.

At a step 1070, the first and second portions of the clip bond are separated and electrically isolated from each other. Step 1070 can be performed by removing or cutting off the third portion of the clip bond. In the preferred embodiment, step 1070 occurs after step 1060 and also after step 1050. Furthermore, before step 1070, the first and second portions of the clip bond are preferably electrically shorted to each other by the third portion of the clip bond. The first and second portions of the clip bond are preferably electrically isolated from each other only after step 1070. In other embodiments, step 1070 can occur between steps 1050 and 1060.

Next, at a step 1080 of flow chart 1000, leads of the lead frame are trimmed. Steps 1070 and 1080 can be performed simultaneously with each other. Then, at step 1090, the leads of the lead frame are formed or bent.

Figure 11:
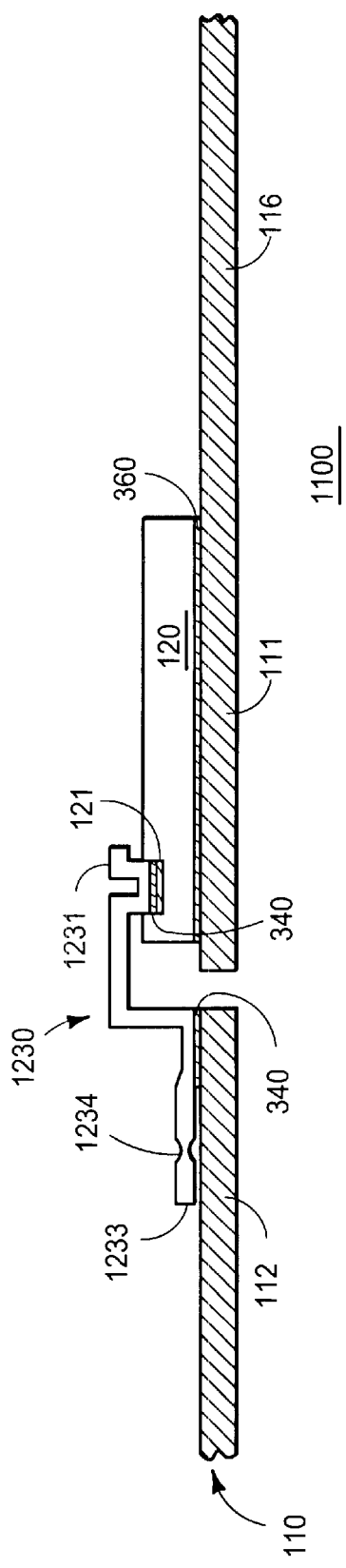
FIG. 11 illustrates a cross-sectional view of a different embodiment of the portion of the semiconductor component in FIG. 3 in accordance with an embodiment of the invention.

FIG. 11 illustrates a cross-sectional view of a portion of a semiconductor component 1100, which is a different embodiment of component 100 in FIG. 3. Component 1100 comprises a clip bond 1230, which is a different embodiment of clip bond 230 in FIG. 3. The top view of clip bond 1230 is similar to the top view of clip bond 230 in FIG. 2.

As illustrated in FIG. 11, clip bond 1230 is located over chip 120 and lead frame 110 in component 1100, and clip bond 1230 couples chip 120 to lead frame 110. A portion 1231 of clip bond 1230 is located over bonding pad 121 of chip 120 and over lead 112 of lead frame 110. Portion 1231 of clip bond 1230 electrically couples together bonding pad 121 and lead 112.

Although not depicted in FIG. 11, clip bond 1230 also includes another portion located over a different portion of chip 120 and a different portion of lead frame 110. This other portion of clip bond 1230 preferably electrically couples together a different bond pad of chip 120 to a different lead of lead frame 110. This other portion of clip bond 1230 is similar to portion 232 of clip bond 230 in FIG. 2.

Clip bond 1230 further includes a portion 1233 that physically and electrically couples together portion 1231 and the other portion of clip bond 1230. Portion 1233 of clip bond 1230 is similar to portion 233 of clip bond 230 in FIG. 3, except that portion 1233 of clip bond 1230 in FIG. 11 is much closer to lead 112 than portion 233 of clip bond 230 in FIG. 3. Portion 1233 of clip bond 1230 in FIG. 11 can contact lead 112. An optional notch 1234 is located adjacent to portion 1233 of clip bond 1230.

Figure 12:
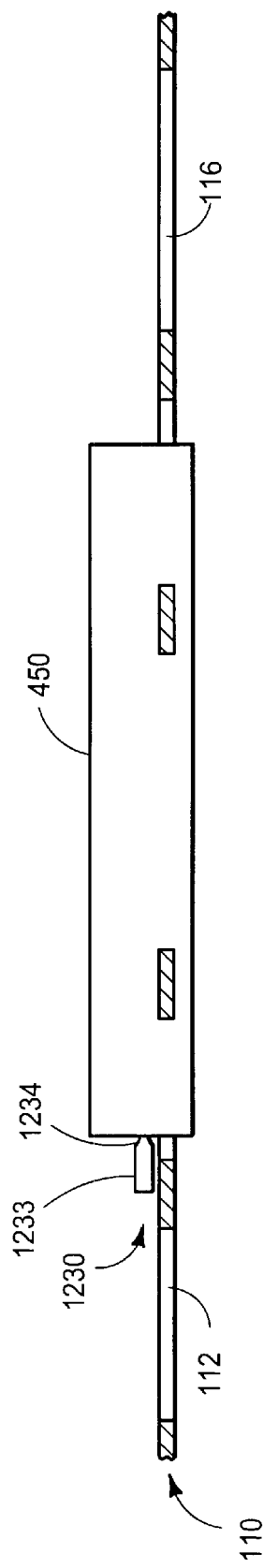
FIG. 12 illustrates a cross-sectional view of a different embodiment of the semiconductor component in FIG. 5 in accordance with an embodiment of the invention.

FIG. 12 illustrates a cross-sectional view of semiconductor component 1100 after a subsequent stage of the manufacturing process. The cross-sectional view of component 1100 in FIG. 12 is similar to the cross-sectional view of component 100 in FIG. 5. Portion 1233 of clip bond 1230 in FIG. 12 protrudes or extends from packaging material 450. Notch 1234 of clip bond 1230 is preferably located at or adjacent to the outside edge of packaging material 450.

Portion 1233 of clip bond 1230 is subsequently removed to divide clip bond 1230 into two physically separate and electrically isolated portions. Portion 1233 of clip bond 1230 can be removed or trimmed from clip bond 1230 before, after, or at the same time that lead 112 is removed or trimmed from lead frame 110. This simultaneous trimming step can decrease the cycle time and increase the throughput of manufacturing process.

Therefore, an improved semiconductor component and method of manufacturing is provided to overcome the disadvantages of the prior art. The method of manufacturing the semiconductor component is not expensive and has a high manufacturing throughput because of the use of a single clip bond that is subsequently singulated into at least two separate portions. Furthermore, the resulting semiconductor component has a chip-to-lead frame interconnect system with low parasitic resistances and inductances because of the use of the clip bond and the elimination of wire bonds.

Although the invention has been described with reference to specific embodiments, it will be understood by those skilled in the art that various changes may be made without departing from the spirit or scope of the invention. For instance, the numerous details set forth herein such as, for example, the size, shape, and configuration of the clip bond and the material composition of the clip bond are provided to facilitate the understanding of the invention and are not provided to limit the scope of the invention. As another example, the removal of a single portion of the clip bond can divide the clip bond into three or more separate portions that are electrically isolated from each other. Furthermore, several portions of the clip bond can be removed to divide the clip bond into the three or more separate portions. Moreover, the clip bond can be divided into at least two physically separated and electrically isolated portions by cutting or trimming the clip bond without removing a portion of the clip bond. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A method of manufacturing a semiconductor component comprising:

coupling a clip bond from a semiconductor chip to a lead frame;

molding a packaging material around the semiconductor chip, at least a portion of the lead frame, and the clip bond; and dividing the clip bond into at least first and second portions separated from each other after the step of molding.

2. The method of claim 1 wherein:

dividing the clip bond occurs after coupling the clip bond.

3. The method of claim 1 wherein:

dividing the clip bond further comprises:
trimming the clip bond into the at least first and second portions.

4. The method of claim 1 wherein:

dividing the clip bond further comprises:
cutting off a third portion of the clip bond.

5. The method of claim 1 wherein:

dividing the clip bond consists of:
cutting off a third portion of the clip bond to divide the clip bond into the at least first and second portions.

6. The method of claim 1 wherein:

coupling the clip bond occurs before dividing the clip bond.

7. The method of claim 1 wherein:

molding the packaging material occurs after coupling the clip bond.

8. The method of claim 7 wherein:

dividing the clip bond occurs after coupling the clip bond.

9. The method of claim 1 wherein:

molding the packaging material occurs before dividing the clip bond and after coupling the clip bond.

10. The method of claim 9 wherein:

dividing the clip bond further comprises:
cutting off a third portion of the clip bond to divide the clip bond into the at least first and second portions.

11. The method of claim 1 further comprising:

trimming leads of the lead frame, wherein:
trimming the leads occurs while dividing the clip bond.

12. The method of claim 1 wherein:

coupling the clip bond further comprises:
using a single clip bond to electrically couple the semiconductor chip to the lead frame.

13. The method of claim 1 further comprising:

avoiding a use of a wire bond to electrically couple the semiconductor chip to the lead frame.

14. A method of manufacturing a semiconductor component comprising:

mounting a semiconductor chip over a lead frame;

adhering a clip bond to the semiconductor chip and the lead frame after mounting to electrically couple the semiconductor chip to the lead frame;

encapsulating the semiconductor chip, at least a portion of the lead frame, and at least first and second portions of the clip bond after adhering; and separating the clip bond into the at least first and second portions after encapsulating.

15. The method of claim 14 wherein:

separating the clip bond further comprises:
cutting off a third portion of the clip bond, the third portion coupled to the at least first and second portions of the clip bond before cutting off the third portion of the clip bond.

16. The method of claim 15 wherein:

encapsulating the semiconductor chip, the at least a portion of the lead frame, and the at least first and second portions of the clip bond further comprises:

preventing the third portion of the clip bond from being encapsulated.

17. The method of claim 16 wherein:
adhering the clip bond further comprises:
   adhering only a single clip bond to the semiconductor chip and the lead frame.

18. The method of claim 17 further comprising:
avoiding a use of a wire bond to electrically couple the semiconductor chip to the lead frame.

19. The method of claim 14 further comprising:

manufacturing a semiconductor device in the semiconductor chip.

20. The method of claim 14 further comprising;

trimming leads of the lead frame; and forming the leads of the lead frame.

* * * * *